(12) United States Patent
Alexander, Jr. et al.

(10) Patent No.: US 6,839,199 B1
(45) Date of Patent: Jan. 4, 2005

(54) DISK DRIVE INCLUDING ELECTRICAL TRACES INTEGRALLY FORMED UPON DISK DRIVE HOUSING

(75) Inventors: McMahan Coyle Alexander, Jr., Santa Ana, CA (US); William W. Garrett, Rancho Santa Margarita, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 0 days.

(21) Appl. No.: 10/678,389

(22) Filed: Oct. 3, 2003

Related U.S. Application Data

(62) Division of application No. 09/866,364, filed on May 24, 2001, now Pat. No. 6,654,200.

(51) Int. Cl.[7] ............................................. G11B 17/02
(52) U.S. Cl. .................................................. 360/97.01
(58) Field of Search ......................... 360/97.01, 98.01, 360/98.07, 99.04, 99.08, 264.7, 264.2

(56) References Cited

U.S. PATENT DOCUMENTS

| 5,551,145 A | | 9/1996 | Jurgenson |
| 5,808,830 A | * | 9/1998 | Stefansky et al. ....... 360/97.01 |
| RE37,869 E | * | 10/2002 | Suzuki ..................... 360/97.01 |

* cited by examiner

Primary Examiner—R. S. Tupper
(74) Attorney, Agent, or Firm—Won Tae C. Kim, Esq.; Milad G. Shara, Esq.; Stetina, Brunda, Garred & Brucker

(57) ABSTRACT

A disk drive for use with a host electronic unit including spindle motor drive circuitry. The disk drive includes a disk drive housing, and a spindle motor rotatably attached to the disk drive housing. The spindle motor includes a stator. The disk drive further includes a host connector attached to the disk drive housing which is operably connectable to the spindle motor drive circuitry for receiving electrical signals from the spindle motor drive circuitry for controlling the spindle motor. The disk drive further includes a stator electrical trace integrally formed upon the disk drive housing from the stator to the host connector for electrically connecting the stator and the host connector.

3 Claims, 8 Drawing Sheets

DISK DRIVE INCLUDING ELECTRICAL TRACES INTEGRALLY FORMED UPON DISK DRIVE HOUSING

CROSS-REFERENCE TO RELATED APPLICATIONS

This patent application is a divisional patent application of and claims priority to U.S. patent application Ser. No. 09/866,364 filed May 24, 2001, now U.S. Pat. No. 6,654,200 the contents of which are incorporated herein by reference.

BACKGROUND OF THE INVENTION

1. Field of the Invention

The present invention relates generally to disk drives, and more particularly to a disk drive having electrical traces formed upon a disk drive housing.

2. Description of the Prior Art

The typical hard disk drive includes a disk drive base, and a head disk assembly (HDA) and a printed circuit board assembly (PCBA) attached to the disk drive base. The head disk assembly includes at least one magnetic disk, a spindle motor for rotating the disk, and a head stack assembly (HSA) that includes at least one transducer head, typically several, for reading and writing data to and from the disk. As discussed further below, the printed circuit board includes functional portions of which may be characterized as spindle motor drive circuitry, actuator drive circuitry, and read channel circuitry.

The head stack assembly includes an actuator assembly, at least one head gimbal assembly, and a flex circuit cable assembly. A conventional "rotary" or "swing-type" actuator assembly typically comprises an actuator body that rotates on a pivot assembly between limited positions, a coil portion that extends from one side of the actuator body to interact with one or more permanent magnets to form a voice coil motor, and one or more actuator arms which extend from an opposite side of the actuator body. The actuator assembly includes the actuator body which has a bore and a pivot bearing cartridge engaged within the bore. A head gimbal assembly includes at least one transducer head, sometimes two, which is distally attached to each of the actuator arms.

The flex circuit cable assembly includes a flex circuit cable which is attached to the actuator assembly and electrically connects the various electrical components onboard the head stack assembly with a relatively minimal impact upon its pivoting movement. The actuator drive circuitry is configured to generate servo control signals. The head stack assembly is controllably positioned in response to the generated servo control signals from the actuator drive circuitry. In so doing, the attached heads are moved relative to tracks disposed upon the disk. As such, the flex circuit cable houses electrical connections between actuator drive circuitry and the coil portion of the actuator assembly. Further, the read channel circuitry is configured to receive data signal from the heads. As such, the flex circuit cable further houses the electrical connections between the read channel circuitry and the heads.

The spindle motor includes a hub that is rotatably attached to the disk drive base. The hub has an outer flange that supports one of the disks. Additional disks may be stacked and separated with spacers. The spindle motor further includes an annular magnet and a spindle motor stator. Where space efficiency is of vital concern, the magnet is typically attached about the lowermost portion of the hub below the flange. The magnet consists of a predetermined number of N and S poles that are disposed alternately circumferentially about the magnet. The spindle motor stator includes an outer rim that is attached to the disk drive base and a plurality of internally facing stator teeth. The stator teeth are equally spaced and extend from the stator rim. The spindle motor stator is sized to fit about the hub and in particular the magnet. Each stator tooth includes windings which selectively conduct current to create a magnetic field that interacts with the various poles of the magnet. Such interaction results in forces applied to the hub which tend to rotate the hub. The spindle motor drive circuitry is configured to generate electrical signals to the stator, and in particular the windings thereof, for controlling the movement of the spindle motor.

A topic of concern is the desire to reduce the overall disk drive size. Such disk drives may have a variety of applications in any number of host electronic devices, such as hand held or portable devices such as computer laptops, cellular telephones, personal digital assistants (PDA), digital cameras, etc. In this regard, a disk drive may be of an internal nature or externally connectable such as in a socket, port or other interface of the associated host electronic unit. The exterior size and shape of the disk drive is often referred to as a "form factor". Reduction of such disk drive form factor has proven challenging. This is because the mere reduction of the size of the various disk drive components may result in such components being unable to conform to required specifications and standard form factors for such components, and may result in installation or assembly difficulties. In this regard, one particular area of focus is the electrical connections between the various electrical components of the disk drive. Accordingly, there is a need in the art for an improved arrangement for the electrical connections between various disk drive electrical components in comparison to the prior art.

SUMMARY OF THE INVENTION

An aspect of the invention can be regarded as a disk drive for use with a host electronic unit including spindle motor drive circuitry. The disk drive includes a disk drive housing, and a spindle motor rotatably attached to the disk drive housing. The spindle motor includes a stator. The disk drive further includes a host connector attached to the disk drive housing which is operably connectable to the spindle motor drive circuitry for receiving electrical signals from the spindle motor drive circuitry for controlling the spindle motor. The disk drive further includes a stator electrical trace integrally formed upon the disk drive housing from the stator to the host connector for electrically connecting the stator and the host connector.

The stator electrical trace may be integrally formed upon the disk drive housing via an electroless plating process. The disk drive housing may be formed of molded plastic. The disk drive housing may have a groove formed therein, and the stator electrical trace is formed within the groove. The host connector may be integrally formed with the disk drive housing. According to another aspect of the present invention there is provided a disk drive for use with a host electronic unit. The disk drive includes a disk drive housing, and a spindle motor rotatably attached to the disk drive housing. The spindle motor includes a stator. The disk drive further includes spindle motor drive circuitry coupled to the disk drive housing. The spindle motor drive circuitry is configured to generate electrical signals for controlling the spindle motor. The disk drive further includes a stator/spindle motor drive circuitry electrical trace integrally formed upon the disk drive housing from the spindle motor drive circuitry to the stator for receiving electrical signals from the spindle motor drive circuitry for controlling the spindle motor. The disk drive further includes a host connector attached to the disk drive housing. The host connector is operably connectable to the host electronic unit. The disk drive further includes a spindle motor drive circuitry/host connector electrical trace integrally formed upon the disk drive housing from the spindle motor drive circuitry to the host connector for electrically connecting the spindle motor drive circuitry with the host electronic unit.

According to another aspect of the present invention there is provided a disk drive for use with a host electronic unit including actuator drive circuitry. The disk drive includes a disk drive housing, and a head stack assembly rotatably attached to the disk drive housing. The head stack assembly includes a coil portion. The disk drive further includes a flex circuit cable operably connected to the coil portion. The disk drive further includes a host connector attached to the disk drive housing. The host connector is operably connectable to the actuator drive circuitry for receiving electrical signals from the actuator drive circuitry for controlling movement of the head stack assembly. The disk drive further includes a coil electrical trace integrally formed upon the disk drive housing from the flex circuit cable to the host connector for electrically connecting the coil portion and the host connector.

The coil electrical traces may be integrally formed upon the disk drive housing via an electroless plating process. The disk drive housing may be formed of molded plastic. The disk drive housing may have a groove formed therein, and the coil electrical trace is formed within the groove. The host connector may be integrally formed with the disk drive housing.

According to another aspect of the present invention there is provided a disk drive for use with a host electronic unit. The disk drive includes a disk drive housing, and a head stack assembly rotatably attached to the disk drive housing. The head stack assembly includes a coil portion. The disk drive further includes a flex circuit cable operably connected to the coil portion. The disk drive further includes actuator drive circuitry coupled to the disk drive housing. The actuator drive circuitry is configured to generate electrical signals for controlling the head stack assembly. The disk drive further includes a flex circuit cable/actuator drive circuitry electrical trace integrally formed upon the disk drive housing from the actuator drive circuitry to the flex circuit cable for receiving electrical signals from the actuator drive circuitry for controlling the head stack assembly. The disk drive further includes a host connector attached to the disk drive housing. The host connector is operably connectable to the host electronic unit. The disk drive further includes an actuator drive circuitry/host connector electrical trace integrally formed upon the disk drive housing from the actuator drive circuitry to the host connector for electrically connecting the actuator drive circuitry with the host electronic unit.

According to another aspect of the present invention there is provided a disk drive for use with a host electronic unit including read channel circuitry. The disk drive includes a disk drive housing, and a head stack assembly rotatably attached to the disk drive housing. The disk drive further includes a preamplifier operably connected to the head stack assembly. The disk drive further includes a host connector attached to the disk drive housing. The host connector is operably connectable to the read channel circuitry for receiving electrical signals from the head stack assembly to the read channel circuitry. The disk drive further includes a preamplifier electrical trace integrally formed upon the disk drive housing from the preamplifier to the host connector for electrically connecting the head stack assembly and the host connector.

The disk drive may further have a flex circuit cable operably connected to the head stack assembly and the preamplifier. The disk drive may further have a flex circuit cable/preamplifier electrical trace integrally formed upon the disk drive housing between the flex circuit cable and the preamplifier. The flex circuit cable/preamplifier electrical trace may be integrally formed upon the disk drive housing via an electroless plating process. The preamplifier electrical trace may be integrally formed upon the disk drive housing via an electroless plating process. The disk drive housing may be formed of molded plastic. The disk drive housing may have a groove formed therein, and the preamplifier electrical trace is formed within the grooves. The host connector may be integrally formed with the disk drive housing.

According to another aspect of the present invention there is provided a disk drive for use with a host electronic unit. The disk drive includes a disk drive housing, and a head stack assembly rotatably attached to the disk drive housing. The disk drive further includes a preamplifier operably connected to the head stack assembly. The disk drive further includes read channel circuitry configured to receive electrical signals from the head stack assembly. The disk drive further includes a preamplifier/read channel circuitry electrical trace integrally formed upon the disk drive housing from the read channel circuitry to the preamplifier for receiving electrical signals by the read channel circuitry from the preamplifier from the head stack assembly. The disk drive further includes a host connector attached to the disk drive housing. The host connector is operably connectable to the host electronic unit. The disk drive further includes a read channel circuitry/host connector electrical trace integrally formed upon the disk drive housing from the read channel circuitry to the host connector for electrically connecting the read channel circuitry with the host electronic unit.

DESCRIPTION OF THE PREFERRED EMBODIMENTS

Figure 1:
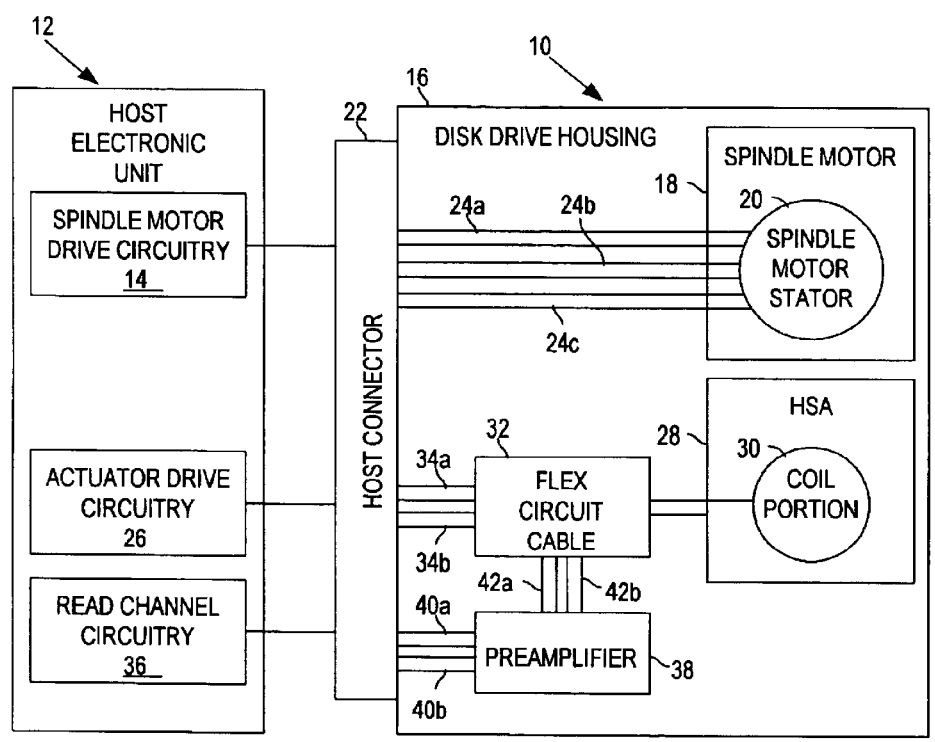
FIG. 1 is a block diagram of a disk drive including electrical traces in accordance with an aspect of the present invention as shown with host electronic unit.

Referring now to the drawings wherein the showings are for purposes of illustrating preferred embodiments of the present invention only, and not for purposes of limiting the same, FIGS. 1–8 illustrate disk drives in accordance with the aspects of the present invention.

Referring now to FIG. 1 there is depicted a block diagram of a disk drive 10 in accordance with an aspect of the present invention as shown with host electronic unit 12. The host electronic unit 12 includes spindle motor drive circuitry 14. According to an aspect of the present invention, the disk drive 10 includes a disk drive housing 16, and a spindle motor 18 rotatably attached to the disk drive housing 16. The spindle motor 18 includes a stator 20. The disk drive 10 further includes a host connector 22 attached to the disk drive housing 16 which is operably connectable to the spindle motor drive circuitry 14 for receiving electrical signals from the spindle motor drive circuitry 14 for controlling the spindle motor 18. The disk drive 10 further includes stator electrical traces 24a–c integrally formed upon the disk drive housing 16 from the stator 20 to the host connector 22 for electrically connecting the stator 20 and the host connector 22.

Figure 2:
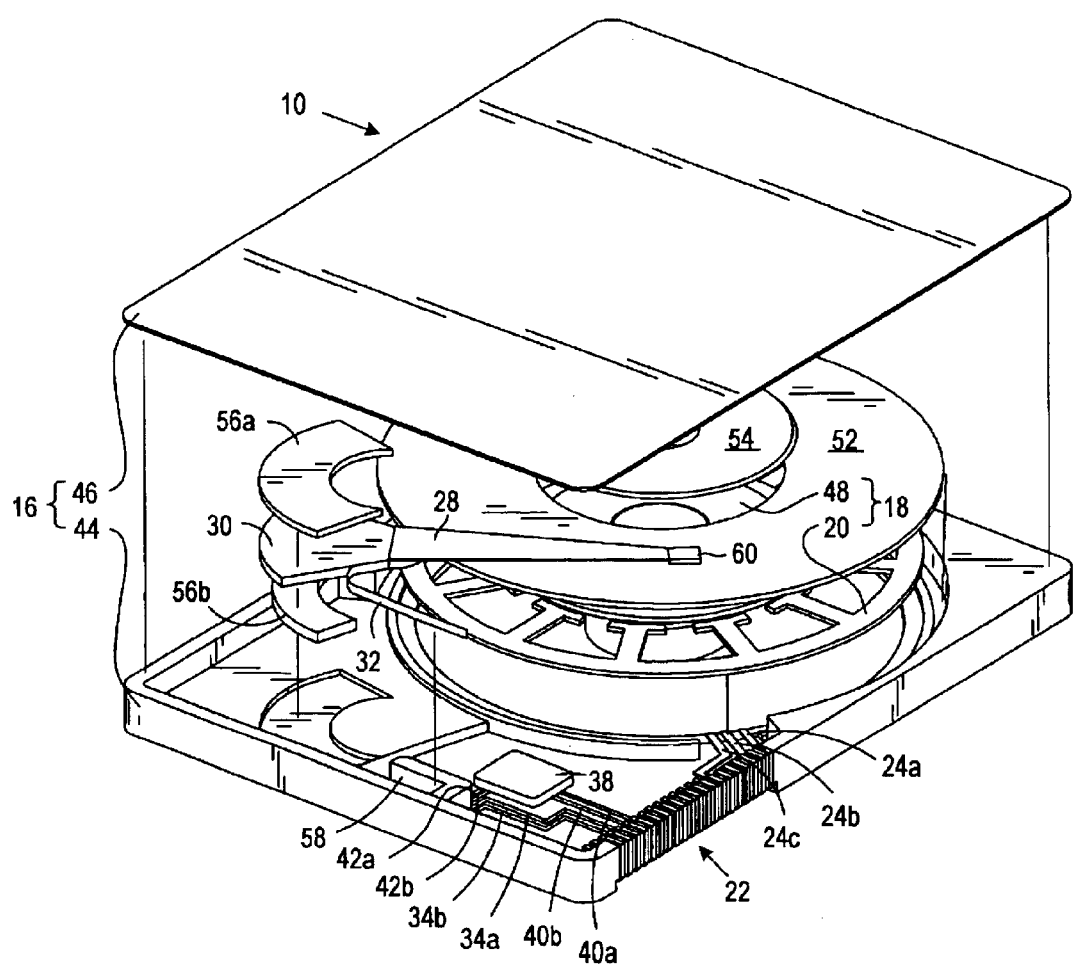
FIG. 2 is an exploded perspective view of a disk drive constructed in accordance with the block diagram of FIG. 1.
Figure 3:
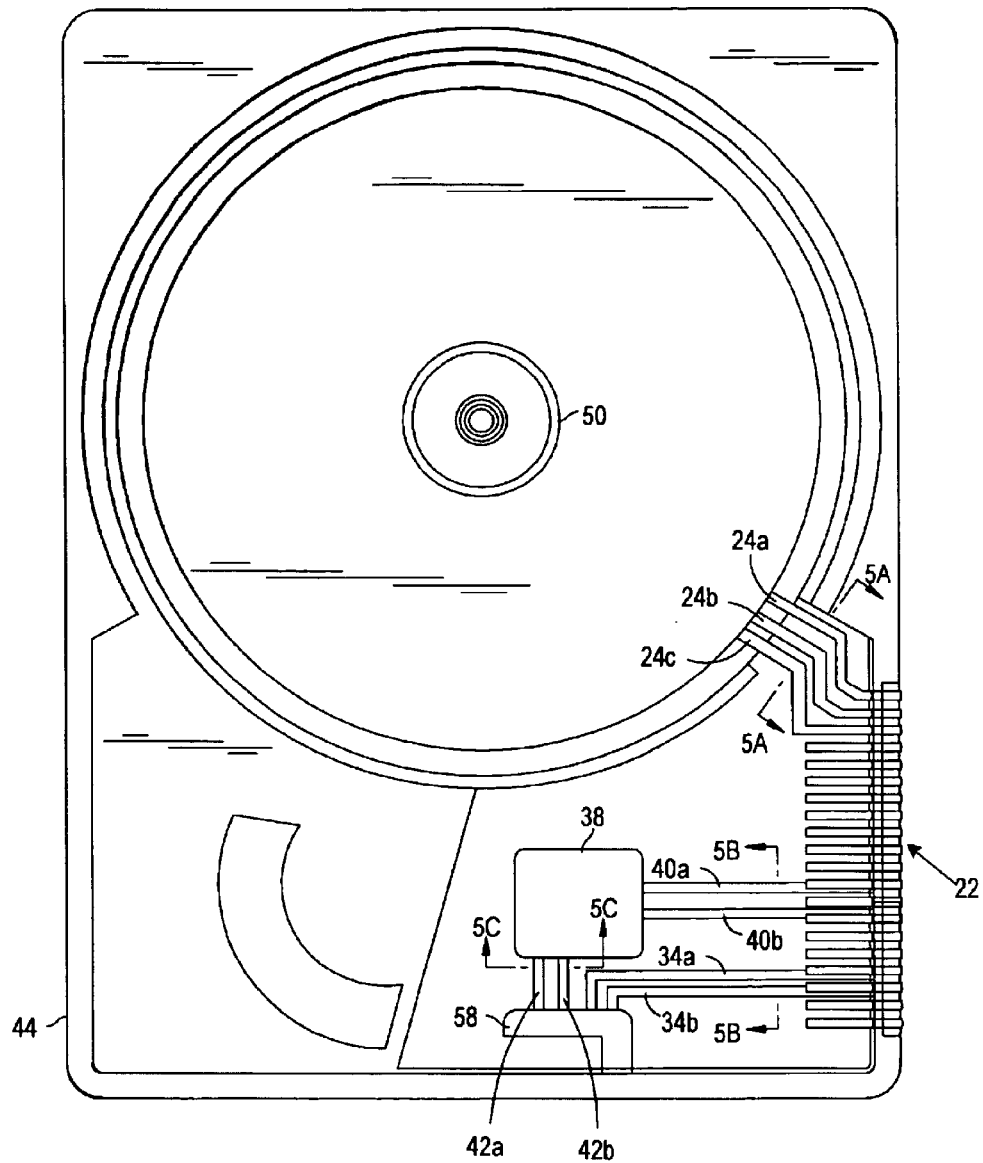
FIG. 3 is a top view of a disk drive base of the disk drive of FIG. 2.
Figure 4:
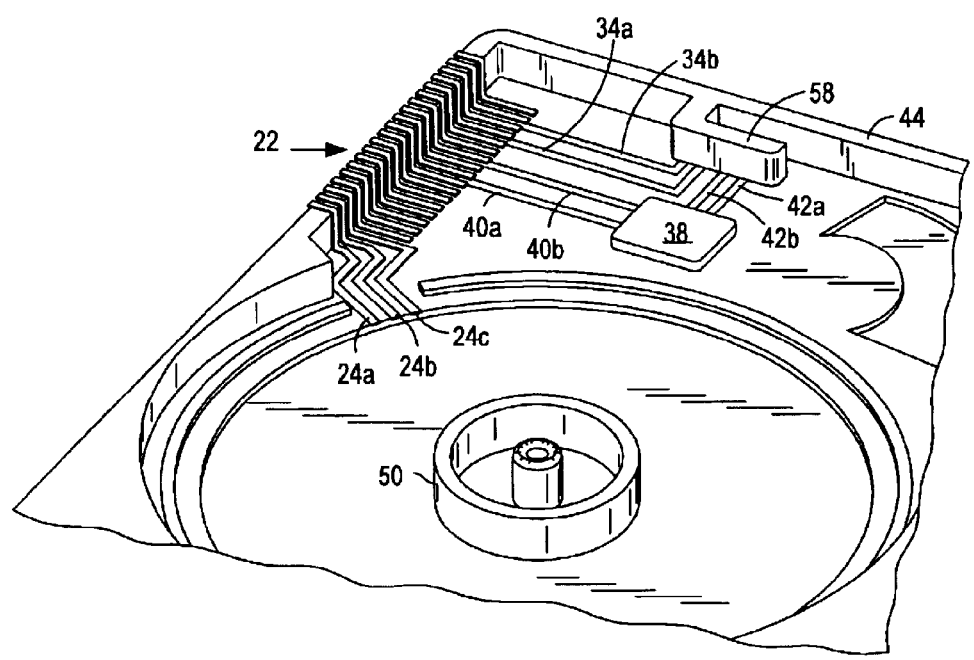
FIG. 4 is a perspective view of a portion of the disk drive base of FIG. 3.

Referring additionally to FIG. 2 there is depicted an exploded perspective view of the disk drive 10 in accordance with an embodiment of the present invention. The disk drive housing 16 may be constructed on one or more parts, such as a disk drive base 44 and disk drive cover 46. Preferably, the disk drive housing 16 is formed of a molded plastic or polymeric material. FIG. 3 depicts a top view of a disk drive base 44 and FIG. 4 depicts a perspective view of a portion of the disk drive base 44. The spindle motor 18 includes a hub 48 that is rotatably attached to the disk drive base 44. The disk drive base 44 may include an annular member 50 upon which the hub 48 is mounted. The hub 48 is configured to support at least one disk 52. A disk clamp 54 may be provided to secure the disk 52 to the hub 48. The hub 48 includes an annular magnet, not shown. The stator 20 is sized to fit about the hub 48 and in particular the magnet. The stator 20, which 11 includes winds, not shown, is configured to selectively conduct current to create a magnetic field that interacts with various poles of the magnet. Such interaction results in forces applied to the hub 48 which tend to rotate the hub 48 and therefore the disk 52. In this regard, the spindle motor drive circuitry 14 generates electrical signals which are passed to windings of the stator 20 via the host connector 22 and the stator electrical traces 24a–c for controlling the movement of the spindle motor 18.

According to another aspect of the present invention there is provided a disk drive 10 for use with a host electronic unit 12 including actuator drive circuitry 26. The disk drive 10 includes the disk drive housing 16, and a head stack assembly 28 rotatably attached to the disk drive housing 16. The head stack assembly 28 includes a coil portion 30. The disk drive 10 further includes a flex circuit cable 32 operably connected to the coil portion 30. The disk drive 10 further includes the host connector 22 attached to the disk drive housing 16. The host connector 22 is operably connectable to the actuator drive circuitry 26 for receiving electrical signals from the actuator drive circuitry 26 for controlling movement of the head stack assembly 28. The disk drive 10 further includes coil electrical traces 34a–b integrally formed upon the disk drive housing 16 from the flex circuit cable 32 to the host connector 22 for electrically connecting the coil portion 30 and the host connector 22.

The head stack assembly 28 includes a head 60 for reading data from the disk 52. In this regard, the head stack assembly 28 is configured to rotate between limited positions for positioning the head 60 relative to the disk 52. A pair of magnets 56a, 56b are attached to the disk drive housing 16, and in particular, the disk drive cover 46 and the disk drive base 44, respectively. The magnets 56a, 56b are positioned to interact with the coil portion 30 to form a voice coil motor. The actuator drive circuitry 26 generates electrical signals which are passed to the coil portion 30 for controlling the movement of the head stack assembly 28. In this regard, such electrical signals are passed through the host connector 22 to the coil electrical traces 34a–b, to the flex circuit cable 32 which is operably connected to the coil portion 30. The disk drive housing 16 may include a cable support 58 for engaging the distal end of the flex circuit cable 32. The cable support 58 may be a molded feature of the disk drive base 44 as shown. The coil electrical traces 34a–b may be formed to electrically connect to the flex circuit cable 32 adjacent the cable support 58 to which the flex circuit cable 32 is attached.

According to another aspect of the present invention there is provided a disk drive 10 for use with a host electronic unit 12 including read channel circuitry 36. The disk drive 10 includes the disk drive housing 16, and the head stack assembly 28 rotatably attached to the disk drive housing 16. The disk drive 10 further includes a preamplifier 38 operably connected to the head stack assembly 28. The disk drive 10 further includes a host connector 22 attached to the disk drive housing 16. The host connector 22 is operably connectable to the read channel circuitry 36 for receiving electrical signals from the head stack assembly 28 to the read channel circuitry 36. The disk drive 10 further includes preamplifier electrical traces 40a–b integrally formed upon the disk drive housing 16 from the preamplifier 38 to the host connector 22 for electrically connecting the head stack assembly 28 and the host connector 22.

The flex circuit cable 32 may further operably connect the head stack assembly 28 to the preamplifier 38. The disk drive 10 may further have flex circuit cable/preamplifier electrical traces 42a–b integrally formed upon the disk drive housing between the flex circuit cable 32 and the preamplifier 38. As mentioned above, the head stack assembly 28 includes the head 60 for reading data from the disk 52. Electrical signals representing such read data are passed through the flex circuit cable 32 to the flex circuit cable/preamplifier electrical traces 42a–b to the preamplifier 38. From the preamplifier 38, electrical signals are then passed to the preamplifier electrical traces 40a–b which are connected to the host connector 22 which is operably connectable to the read channel circuitry 36. In addition, though not shown, coil electrical traces 34a–b may be configured to pass through preamplifier 38.

The host connector 22 is configured to connect the disk drive 10 to the host electronic unit 12. Preferably, the host connector 22 is integrally formed with the disk drive housing 16 as shown in FIGS. 2–4. Advantageously, usage of molded plastic facilitates such integration of electrical connections and/or components of the host connector 22 with disk drive base 44. It is also contemplated that the host connector 22 may be a separately formed component from the disk drive housing 16.

In the preferred embodiment of the present invention, the stator electrical traces 24a–c, the coil electrical traces 34a–b, the preamplifier electrical traces 40a–b and the flex circuit cable/preamplifier electrical traces 42a–b are integrally formed upon the disk drive housing 16 via an electroless plating process. It is contemplated that such a process is not only suitable for formation upon molded plastic but is also is relatively low cost and lends itself to mass production. However, other fabrication techniques may be utilized which are well known to one of ordinary skill in the art such as other plating processes, deposition and even photoimaging techniques. Further, while the traces 24a–c, 34a–b, 40a–b and 42a–b are depicted to completely extend between their associated electrical components, only a portion of the related electrical path need be completed by such electrical traces 24a–c, 34a–b, 40a–b and 42a–b. The electrical traces 24a–c, 34a–b, 40a–b and 42a–b may further include end and intermediate connection points such vias and solder locations. While the traces 24a–c, 34a–b, 40a–b and 42a–b are shown to be disposed upon the disk drive base 44, they maybe formed anywhere about the disk drive housing 16, including the disk drive cover 46, whether internally (as shown) or externally to the disk drive 10. Moreover, the number of electrical traces, such as the stator electrical traces 24a–c, the preamplifier electrical traces 40a–b, the coil electrical traces 34a–b, the preamplifier electrical traces 40a–b, and the flex circuit cable/preamplifier electrical traces 42a–b, may be more or less than the number disclosed herein and is dependent on the number of electrical signal paths desired.

Figure 5A:
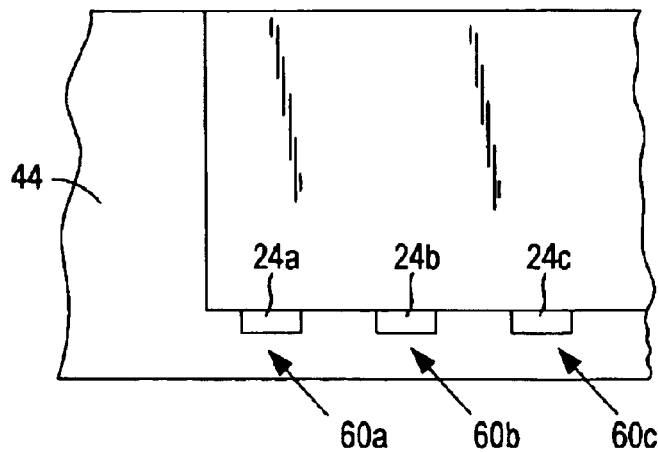
FIG. 5a is a cross sectional view of a portion of the disk drive base as seen along axis 5a—5a of FIG. 3.
Figure 5B:
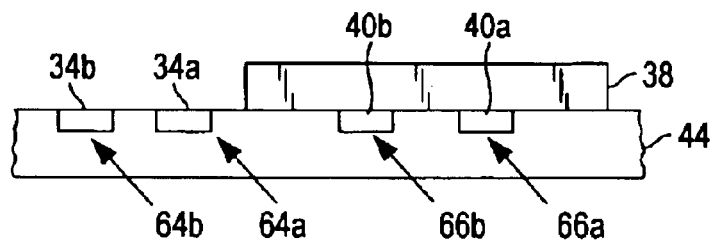
FIG. 5b is a cross sectional view of a portion of the disk drive base as seen along axis 5b—5b of FIG. 3.
Figure 5C:
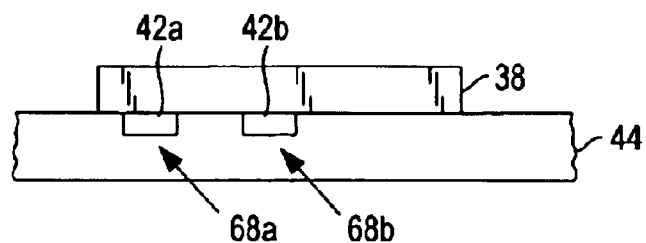
FIG. 5c is a cross sectional view of a portion of the disk drive base as seen along axis 5c—5c of FIG. 3.

Referring now to FIG. 5a there is depicted a cross sectional view of a portion of the disk drive base 44 as seen along axis 5a—5a of FIG. 3. The disk drive base 44 may include grooves 62a–c formed therein and the stator electrical traces 24a–c may be formed within the grooves 62a–c. Such grooving is contemplated to facilitate ease fabrication of the stator electrical traces 24a–c upon the disk drive base 44. Similarly, referring now to FIG. 5b is a cross sectional views of a portion of the disk drive base 44 as seen along axis 5b—5b of FIG. 3. The disk drive base 44 may include grooves 64, 66 formed therein and the coil electrical traces 34a–b and preamplifier electrical traces 40a–b may be respectively formed within the grooves 64a–b, 66a–b. Similarly, referring now to FIG. 5c is a cross sectional views of a portion of the disk drive base 44 as seen along axis 5c—5c of FIG. 3. The disk drive base 44 may further include grooves 68a–b formed therein and the flex circuit cable/preamplifier electrical traces 42a–b may be formed within the grooves 68a–b.

Figure 6:
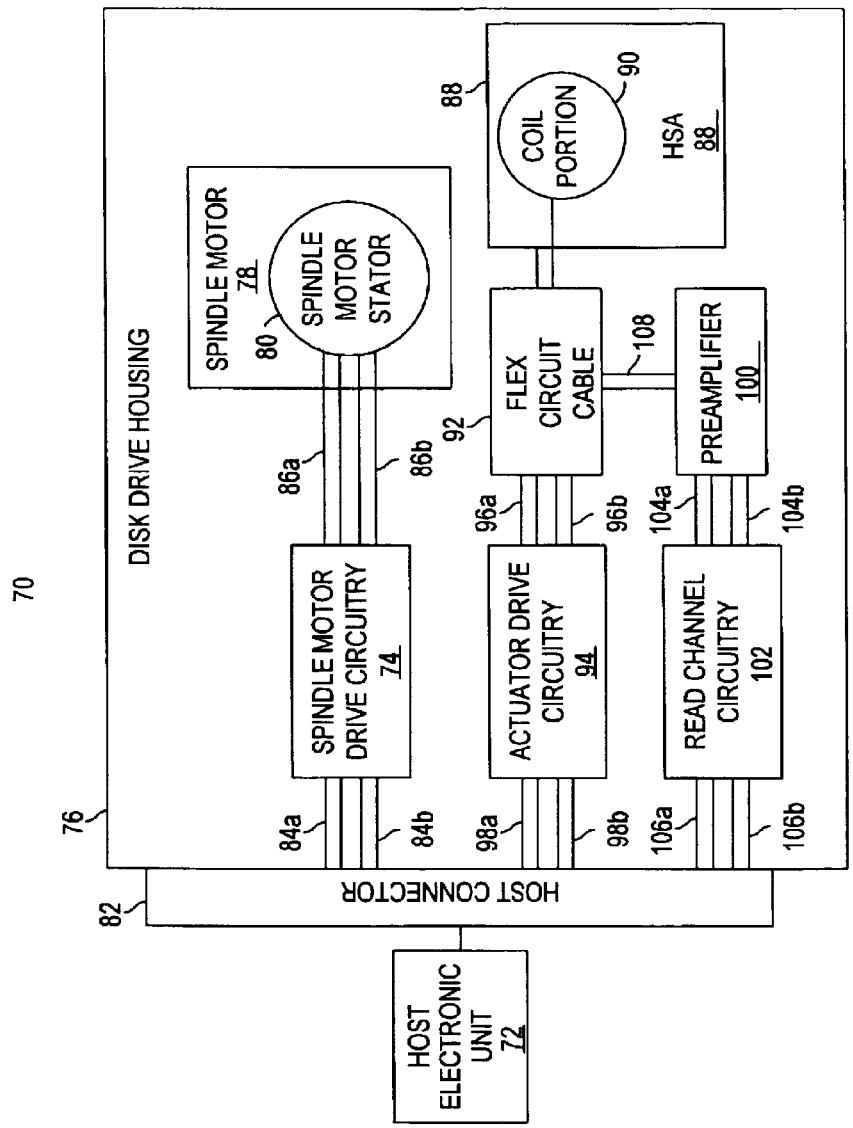
FIG. 6 is a block diagram of a disk drive including electrical traces as constructed in accordance with another aspect of the present invention as shown with host electronic unit.

Referring now to FIG. 6, according to yet another aspect of the present invention there is provided a disk drive 70 for use with a host electronic unit 72. The disk drive 70 includes a disk drive housing 76, and a spindle motor 78 rotatably attached to the disk drive housing 76. The spindle motor 78 includes a stator 80. The disk drive 70 further includes spindle motor drive circuitry 74 coupled to the disk drive housing 76. The spindle motor drive circuitry 74 is configured to generate electrical signals for controlling the spindle motor 78. The disk drive 70 further includes stator/spindle motor drive circuitry electrical traces 86a–b integrally formed upon the disk drive housing 76 from the spindle motor drive circuitry 74 to the stator for receiving electrical signals from the spindle motor drive circuitry 74 for controlling the spindle motor 78. The disk drive 70 further includes a host connector 82 attached to the disk drive housing 76. The host connector 82 is operably connectable to the host electronic unit 72. The disk drive 70 further includes spindle motor drive circuitry/host connector electrical traces 84a–b integrally formed upon the disk drive housing 76 from the spindle motor drive circuitry 74 to the host connector 82 for electrically connecting the spindle motor drive circuitry 74 with the host electronic unit 72. It is understood that this embodiment of the present invent is similar in configuration to the disk drive 10 discussed above, however, while the spindle motor drive circuitry 14 is a component of the host electronic unit 12, the spindle motor drive circuitry 74 is onboard the disk drive 70.

According to another aspect of the present invention there is provided a disk drive 70 for use with a host electronic unit 72. The disk drive 70 includes the disk drive housing 76, and a head stack assembly 88 rotatably attached to the disk drive housing 76. The head stack assembly 88 includes a coil portion 90. The disk drive 70 further includes a flex circuit cable 92 operably connected to the coil portion 90. The disk drive 70 further includes actuator drive circuitry 94 coupled to the disk drive housing 76. The actuator drive circuitry 94 is configured to generate electrical signals for controlling the head stack assembly 88. The disk drive 70 further includes flex circuit cable/actuator drive circuitry electrical traces 96a–b integrally formed upon the disk drive housing 76 from the actuator drive circuitry 94 to the flex circuit cable 92 for receiving electrical signals from the actuator drive circuitry 94 for controlling the head stack assembly 88. The disk drive 76 further includes the host connector 82 attached to the disk drive housing 76. The host connector 82 is operably connectable to the host electronic unit 72. The disk drive 70 further includes actuator drive circuitry/host connector electrical traces 98a–b integrally formed upon the disk drive housing 76 from the actuator drive circuitry 94 to the host connector 82 for electrically connecting the actuator drive circuitry 94 with the host electronic unit 72. It is understood that this embodiment of the present invention is similar in configuration to the disk drive 10 discussed above, however, while the actuator drive circuitry 26 is a component of the host electronic unit 12, the actuator drive circuitry motor drive circuitry 94 is onboard the disk drive 70.

According to another aspect of the present invention there is provided a disk drive 70 for use with a host electronic unit 72. The disk drive 70 includes the disk drive housing 76, and the head stack assembly 88 rotatably attached to the disk drive housing 76. The disk drive 70 further includes a preamplifier 100 operably connected to the head stack assembly 88. The disk drive 70 further includes read channel circuitry 102 configured to receive electrical signals from the head stack assembly 88. The disk drive 70 further includes preamplifier/read channel circuitry electrical traces 104a–b integrally formed upon the disk drive housing 76 from the read channel circuitry 102 to the preamplifier 100 for receiving electrical signals by the read channel circuitry 102 from the preamplifier 100 from the head stack assembly 88. The disk drive 70 further includes the host connector 82 attached to the disk drive housing 76. The host connector 82 is operably connectable to the host electronic unit 72. The disk drive 70 further includes read channel circuitry/host connector electrical traces 106a–b integrally formed upon the disk drive housing 76 from the read channel circuitry to the host connector for electrically connecting the read channel circuitry with the host electronic unit 72. It is understood that this embodiment of the present invention is similar in configuration to the disk drive 10 discussed above, however, while the read channel circuitry 36 is a component of the host electronic unit 12, the read channel circuitry 102 is onboard the disk drive 70.

The flex circuit cable 92 may further operably connect the head stack assembly 88 to the preamplifier 100. The disk drive 70 may further have flex circuit cable/preamplifier electrical traces 108a–b integrally formed upon the disk drive housing 76 between the flex circuit cable 92 and the preamplifier 100.

Figure 7:
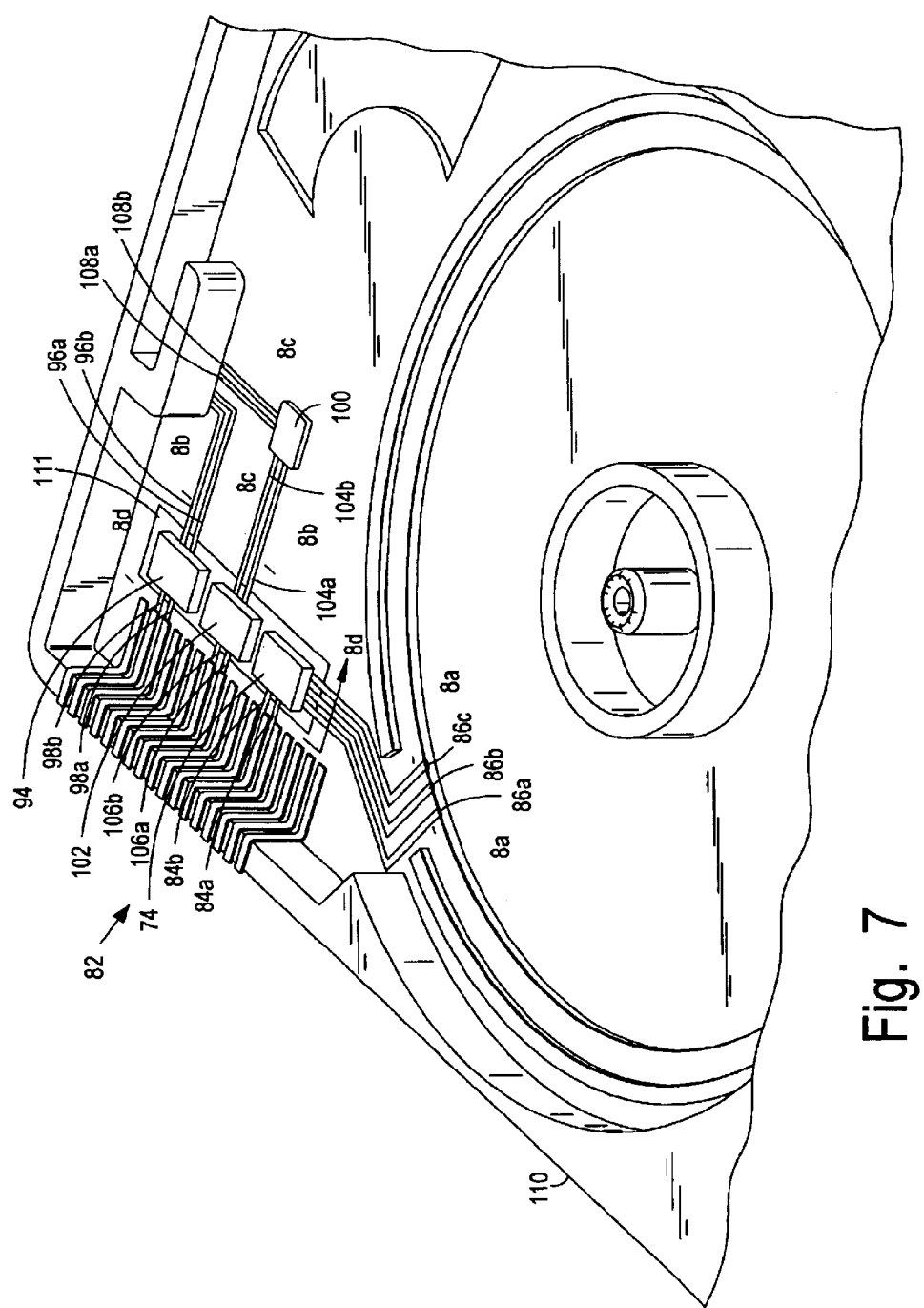
FIG. 7 is a partial perspective view of a disk drive base of the disk drive accordance with the block diagram of FIG. 6.
Figure 8A:
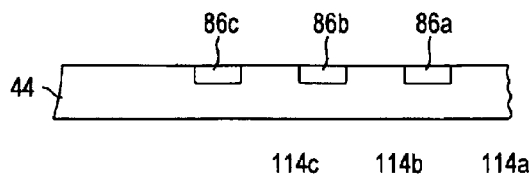
FIG. 8a is a cross sectional view of a portion of the disk drive base as seen along axis 8a—8a of FIG. 7.
Figure 8B:
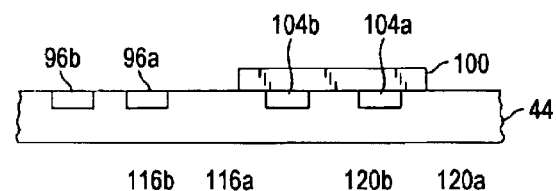
FIG. 8b is a cross sectional view of a portion of the disk drive base as seen along axis 8b—8b of FIG. 7.
Figure 8C:
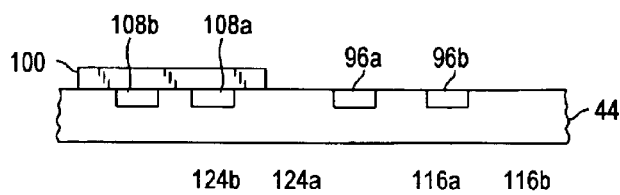
FIG. 8c is a cross sectional view of a portion of the disk drive base as seen along axis 8c—8c of FIG. 7.
Figure 8D:
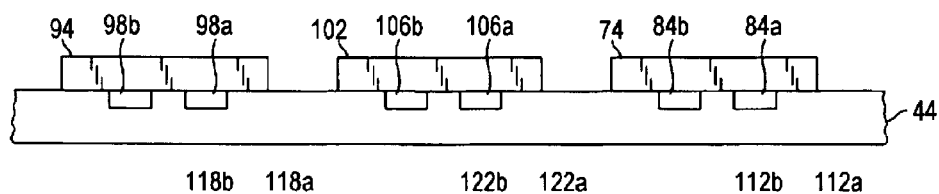
FIG. 8d is a cross sectional view of a portion of the disk drive base as seen along axis 8d—8d of FIG. 7.

The electrical traces 84a–c, 86a–b, 96a–b, 98a–b, 104a–b, 106a–b and 108a–b may be formed similar to the electrical traces 24a–c, 34a–b, 40a–b and 42a–b of disk drive 10 as discussed above. Referring additionally to FIG. 7, the disk drive housing may include a disk drive base 110. A printed circuit board 111 may be attached to the disk drive base 110 and the spindle motor drive circuitry 74, actuator drive circuitry 94 and the read channel circuitry 102 may be mounted upon the printed circuit board 111. In this regard, the term "attached" may refer to a direct attachment or to a more indirect attachment such as the spindle motor drive circuitry 74 being attached to the disk drive base 110 via the printed circuit board 111.

Referring now to FIGS. 8a–d, there are depicted cross sectional views of portions of the disk drive base 110 as seen respectively along axes 8a—8a, 8b—8b, 8c—8c, and 8d—8d of FIG. 7. The disk drive base 110 may include grooves 112a–c, 14a–b, 116a–b, 118a–b, 120a–b, 122a–b and 124a–b formed therein and the electrical traces 84a–c, 86a–b, 96a–b, 98a–b, 104a–b, 106a–b and 108a–b may be respectively formed within the grooves 112a–c, 114a–b, 116a–b, 118a–b, 120a–b, 122a–b and 124a–b.

We claim:

1. A disk drive for use with a host electronic unit, the disk drive comprising:
    a disk drive housing having a groove formed therein;
    a spindle motor rotatably attached to the disk drive housing, the spindle motor including a stator;
    spindle motor drive circuitry coupled to the disk drive housing, the spindle motor drive circuitry being configured to generate electrical signals for controlling the spindle motor;
    a stator/spindle motor drive circuitry electrical trace integrally formed upon the disk drive housing within the groove from the spindle motor drive circuitry to the stator for receiving electrical signals from the spindle motor drive circuitry for controlling the spindle motor;
    a host connector attached to the disk drive housing, the host connector being operably connectable to the host electronic unit; and
    a spindle motor drive circuitry/host connector electrical trace integrally formed upon the disk drive housing within the groove from the spindle motor drive circuitry to the host connector for electrically connecting the spindle motor drive circuitry with the host electronic unit.

2. A disk drive for use with a host electronic unit, the disk drive comprising:
    a disk drive housing having a groove formed therein;
    a head stack assembly rotatably attached to the disk drive housing, the head stack assembly including a coil portion;
    a flex circuit cable operably connected to the coil portion;
    actuator drive circuitry coupled to the disk drive housing, the actuator drive circuitry being configured to generate electrical signals for controlling the head stack assembly;
    a flex circuit cable/actuator drive circuitry electrical trace integrally formed upon the disk drive housing within the groove from the actuator drive circuitry to the flex circuit cable for receiving electrical signals from the actuator drive circuitry for controlling the head stack assembly;
    a host connector attached to the disk drive housing, the host connector being operably connectable to the host electronic unit; and
    an actuator drive circuitry/host connector electrical trace integrally formed upon the disk drive housing within the groove from the actuator drive circuitry to the host connector for electrically connecting the actuator drive circuitry with the host electronic unit.

3. A disk drive for use with a host electronic unit, the disk drive comprising:
    a disk drive housing having a groove formed therein;
    a head stack assembly rotatably attached to the disk drive housing;
    a preamplifier operably connected to the head stack assembly;
    read channel circuitry configured to receive electrical signals from the head stack assembly;
    a preamplifier/read channel circuitry electrical trace integrally formed upon the disk drive housing within the groove from the read channel circuitry to the preamplifier for receiving electrical signals by the read channel circuitry from the preamplifier from the head stack assembly;
    a host connector attached to the disk drive housing, the host connector being operably connectable to the host electronic unit; and
    a read channel circuitry/host connector electrical trace integrally formed upon the disk drive housing within the groove from the read channel circuitry to the host connector for electrically connecting the read channel circuitry with the host electronic unit.

* * * * *